United States Patent [19]

Kobayashi

[11] Patent Number: 4,641,353
[45] Date of Patent: Feb. 3, 1987

[54] INSPECTION METHOD AND APPARATUS FOR A MASK PATTERN USED IN SEMICONDUCTOR DEVICE FABRICATION

[75] Inventor: Kenichi Kobayashi, Tokyo, Japan

[73] Assignee: Fujitsu Limited, Kawasaki, Japan

[21] Appl. No.: 648,911

[22] Filed: Sep. 10, 1984

[30] Foreign Application Priority Data

Sep. 16, 1983 [JP] Japan ................. 58-170796

[51] Int. Cl.⁴ ................. G06K 9/00; G06K 9/60
[52] U.S. Cl. ................. 382/8; 358/101; 358/106; 356/390; 156/627
[58] Field of Search ................. 382/8; 358/101, 106; 156/626, 627; 356/390

[56] References Cited

U.S. PATENT DOCUMENTS

| | | | |
|---|---|---|---|
| 4,472,738 | 9/1984 | Hada et al. | 358/106 |
| 4,532,650 | 7/1985 | Wihl et al. | 358/106 |
| 4,542,404 | 9/1985 | Duschl | 358/106 |
| 4,555,798 | 11/1985 | Broadbent, Jr. et al. | 358/106 |

Primary Examiner—Howard A. Birmiel
Attorney, Agent, or Firm—Armstrong, Nikaido, Marmelstein & Kubovcik

[57] ABSTRACT

An inspection method and apparatus for a mask pattern such as a reticle pattern used in the fabrication of a semiconductor device is disclosed. The mask pattern is inspected by an imaging sensor mounted on a stage on which a fabricated object is also mounted. The imaging sensor converts an optical image of the mask pattern which is intended to be exposed on the object to a video signal and it is inspected by comparing it with another video signal provided from data for designing the mask pattern. This inspection is made before the process of exposing the mask pattern on the fabricated object in order to avoid a waste of time in the semiconductor pattern process.

24 Claims, 10 Drawing Figures

INSPECTION METHOD AND APPARATUS FOR A MASK PATTERN USED IN SEMICONDUCTOR DEVICE FABRICATION

BACKGROUND OF THE INVENTION

The present invention relates to an inspection method and apparatus for a mask pattern on a photomask or a wafer used in the fabrication of a semiconductor device such as an integrated circuit (IC) or a large scale integrated circuit (LSI).

For the sake of convenience, the short term "IC" will be used as a "semiconductor integrated circuit device" in this disclosure hereinafter.

In an IC patterning process, there are two ways to print a mother pattern called a "reticle pattern" on a wafer. One is a technique of applying a photomask, and the other is to print the reticle pattern directly on the wafer. FIGS. 1 and 2 show the patterning processes in prior art IC fabrication with FIG. 1 for the former and FIG. 2 for the later. In the technique of FIG. 1, the IC pattern of the photomask is first made from the reticle pattern by a step and repeat printing method, and then the IC pattern of the photomask is directly printed on the wafer. In the technique of FIG. 2, the reticle pattern is directly printed on the wafer by a step and repeat method without making the photomask.

In FIGS. 1 and 2, the reticle 100 is made of a piece of silicate glass for example, on which a mother pattern is printed photographically from an original pattern. The mother pattern 101 is called a "reticle pattern" herein. As the reticle pattern 101 is the mother pattern, the pattern must be made with high accuracy, and therefore, the size of the pattern is as large as 5 to 10 times the actual IC size. The reticle pattern is printed on the photomask or the wafer by an optical system having a reduction factor of the value between 1/10 and 1/5.

In FIG. 1, the reticle pattern 101 of the reticle 100 is exposed on a photographic plate fabricated on the surface of the photomask 200 by an optical system 105 having a reduction factor of the same value between 1/10 and 1/5. The exposure is made by a step and repeat procedure moving the photomask 200 in X and Y directions. An individual IC pattern 201 is on the photomask 200, and its size is equal to that of an IC pattern on the wafer. Therefore, after fabricating the photomask, the photomask pattern having a plurality of the IC patterns is exposed on the surface of the wafer 300 in equal size; that is, the size of an IC pattern 301 on the wafer 300 is equal to that of the IC pattern 201 on the photomask 200. An arrow 205 shows this direct printing without reduction or magnification.

In FIG. 2, the reticle pattern of the reticle 100 is exposed on the surface of the wafer 300 by an optical system 305 having a reduction factor between 1/10 and 1/5 for the same reason mentioned above in FIG. 1. The exposure for printing is also made by the step and repeat procedure similar to the technique of FIG. 1, by moving the wafer 300 in the X and Y directions. An individual IC pattern 301 is on the wafer 300.

The term "printed pattern" will be used hereinafter for the printed IC patterns on the photomask 200 or the wafer 300 in FIG. 1, and on the wafer 300 in FIG. 2. Whereas, the term "mask pattern" will be used for the IC patterns on the photomask 200 in FIG. 1, and the reticle pattern 101 on the reticle 100 in FIG. 2. Similarly, as the reticle pattern itself is made by printing an original pattern as mentioned before, the original pattern becomes a mask pattern and the reticle pattern 101 on the reticle 100 becomes a printed pattern in this case.

The exposing process for the printing is very important in the IC patterning process, and a defect can not be allowed to exist. However, it has become necessary to pay great attention to the fact that recently a high probability of incorrect printing has tended to occur because the IC pattern has become very small and complicated to increase the IC packing density.

FIG. 3 shows examples of defects in the printed patterns. FIG. 3(a) shows an original pattern of the reticle pattern, FIG. 3(b) shows an example of a defect in the printed pattern (reticle pattern) on the reticle, and FIG. 3(c) shows another example of a defect in the printed reticle pattern. In FIG. 3(b), the printed pattern 1001 has an incorrect part 1011 which is produced primarily by an incorrect developing process. In FIG. 3(c), the printed pattern 1002 has a defective part 1012 which is produced primarily by an incorrect exposing process.

Defects of these types will also occur in the patterning process of the wafer, and in each case, the defect occurs in the exposing or printing process presupposing that the mask pattern is correct. Therefore, it can be said that the defect can be avoided by paying attention to the semiconductor patterning process. However, if the mask pattern itself has a defect or dust exists near by the mask pattern, an abnormality on the printed pattern cannot be avoided.

FIG. 4 illustrates an example showing the same patterning process as FIG. 2; that is, the wafer is printed directly from the reticle pattern of the reticle. In FIG. 4, a reticle 12, a wafer 16, and an optical system 20 having a reduction factor of the value between 1/10 and 1/5 are shown. A reticle pattern 60 and a piece of dust 14 are shown on the reticle 12. If the dust 14 exists on the reticle 12, a dust pattern 141 is printed on the wafer 16 beside a correct printed pattern 18 of the mask pattern 60. FIG. 4 (b) shows an expanded perspective illustration of the printed pattern on the wafer 16. Though it is not shown in the drawings, the dust pattern 141 is printed on all the patterns on the wafer 16.

If dust is on the mask pattern or if the mask pattern itself has a defect, the whole patterning process ends in a failure. If such problems occur, the IC product suffers damage even though every later process is correct. This has a great influence on the IC cost, because the IC patterning process becomes much too complicated as the packing density increases. Thus, the cause of the defect must be found and removed as quickly as possible in the early stage of the patterning process.

Usually, the reticle pattern itself can be carefully inspected by various methods. Therefore, a problem caused by defects of the reticle pattern itself can be avoided. However, when a reticle pattern, which has been inspected and judged to have no defects, is printed on the wafer, still the following problems may occur.

First, when the reticle is mounted on a projecting system as shown by the reticle 12 in FIG. 4(a) and dust happens to be stuck on the reticle, the image of the dust is printed. Second, when the optical system has some defect, the reticle pattern can not be correctly printed on the wafer.

Thus, though the reticle pattern itself is perfect, the above problems are produced after reticle inspection, and cause a defect to the actual optical image of the reticle pattern projected on the wafer. The optical image can not be detected by the prior art reticle inspection.

SUMMARY OF THE INVENTION

Therefore, an object of the present invention is to improve the inspection method and apparatus of the mask pattern in order to find defects on an actually exposed mask pattern caused by dust on the mask or a defect in the optical system. A defect of this kind has not been able to be detected by prior art inspection method such as a comparing method.

Another object of the present invention is to save time and reduce cost in IC production.

The present invention is performed by using an image sensor on the stage on which a wafer or a photomask is mounted. An optical image of the mask pattern is projected onto the image sensor which produces a video signal called a sensor video signal. This optical image of the mask pattern is almost identical to the actual exposed pattern on the wafer. The sensor video signal is compared with a data video signal which is a standard video signal prepared from a design database to fabricate the mask pattern. The comparison is made just prior to exposing the mask pattern on the fabricated object, so that the almost actually exposed pattern can be inspected. This contributes very much to reduce the cost of an IC product.

BRIEF DESCRIPTION OF THE DRAWINGS

FIGS. 3(a)–3(c) show examples of an original pattern and some defects on the printed pattern of the original pattern wherein FIG. 3(a) shows an example of the original pattern for the reticle mask pattern; FIG. 3(b) shows an example of a defect on the printed pattern of the original reticle pattern; and FIG. 3(c) shows another example of a defect on the printed pattern of the original reticle pattern;

FIGS. 4(a) and 4(b) show a prior art fabrication system for semiconductor devices and the detail of the printed pattern in the system wherein FIG. 4(a) is a perspective illustration showing a semiconductor fabricating system having a reticle, and optical system, and a wafer; and FIG. 4(b) shows a partially expanded view of the printed pattern;

DETAILED DESCRIPTION OF THE PREFERRED EMBODIMENT

Figure 1:
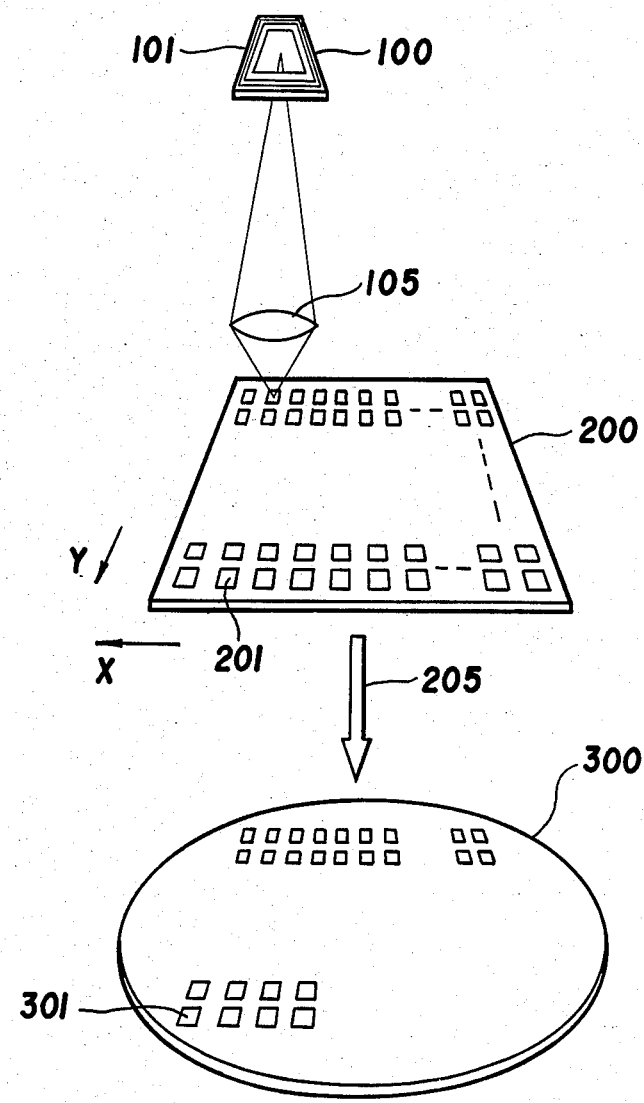
FIG. 1 is a perspective illustration showing the principle of a patterning process for semiconductor devices.
Figure 2:
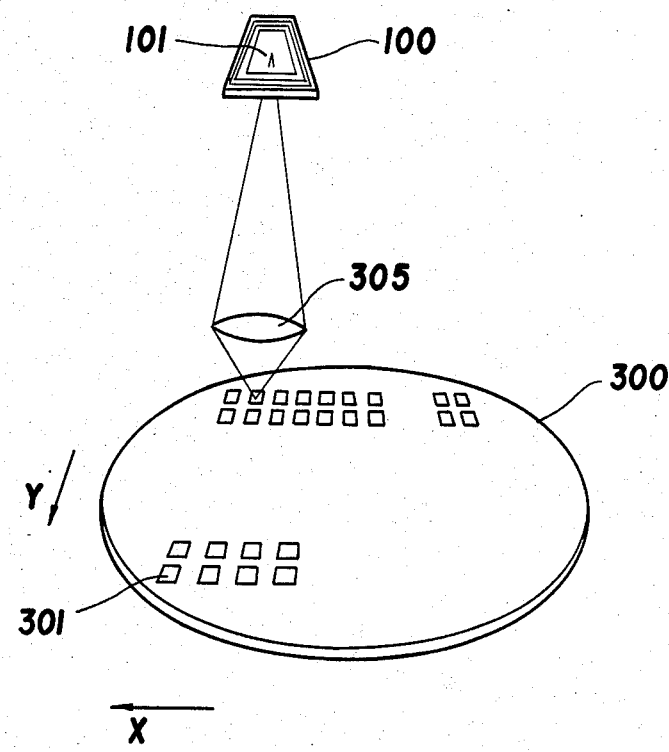
FIG. 2 is a perspective illustration showing the principle of another patterning process.
Figure 3A:
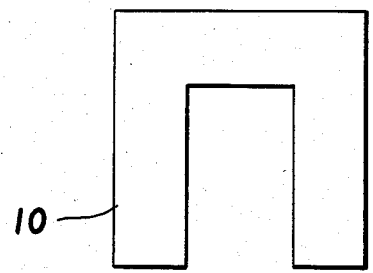
Figure 3B:
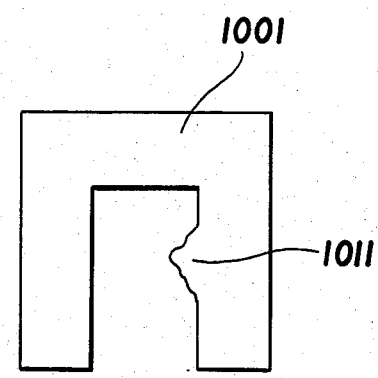
Figure 3C:
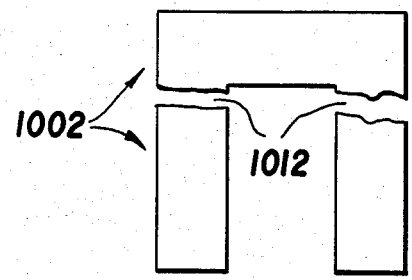
Figure 4A:
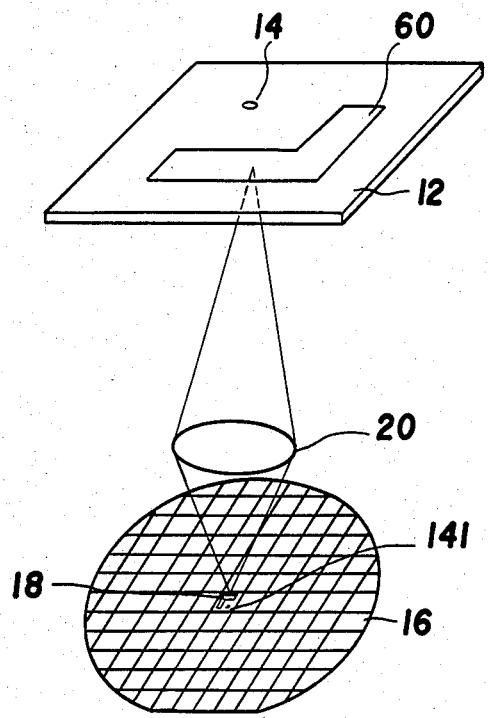
Figure 4B:
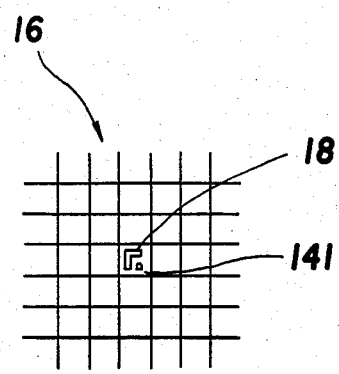
Figure 5:
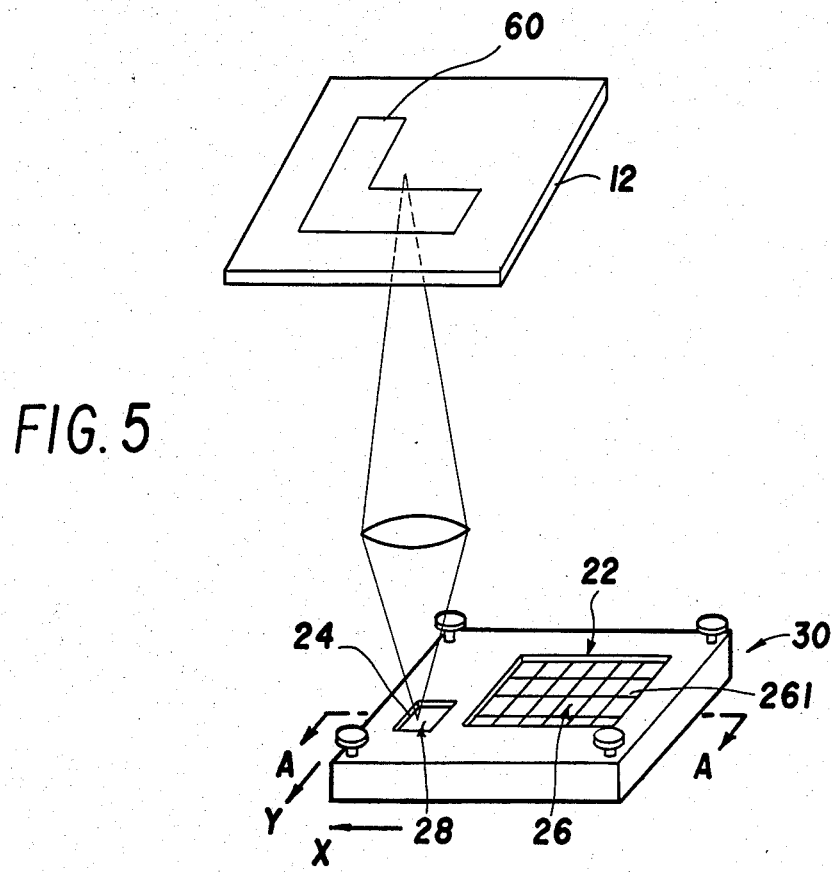
FIG. 5 is a perspective illustration showing an embodiment of the present invention for a semiconductor fabricating system which includes an inspecting system.
Figure 6:
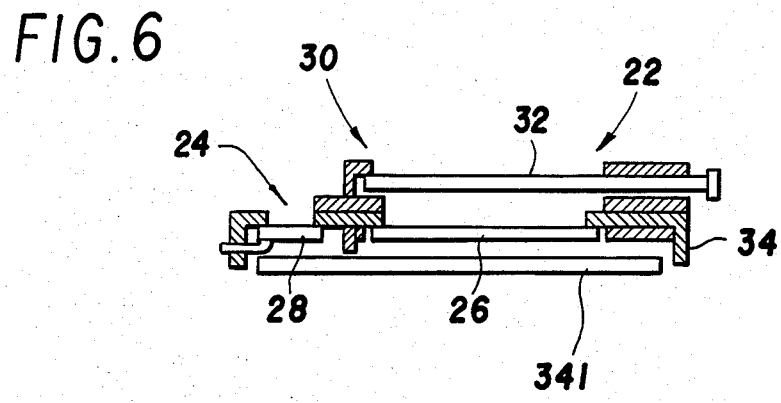
FIG. 6 is a sectional view of a stage at A—A shown in FIG. 5.
Figure 7:
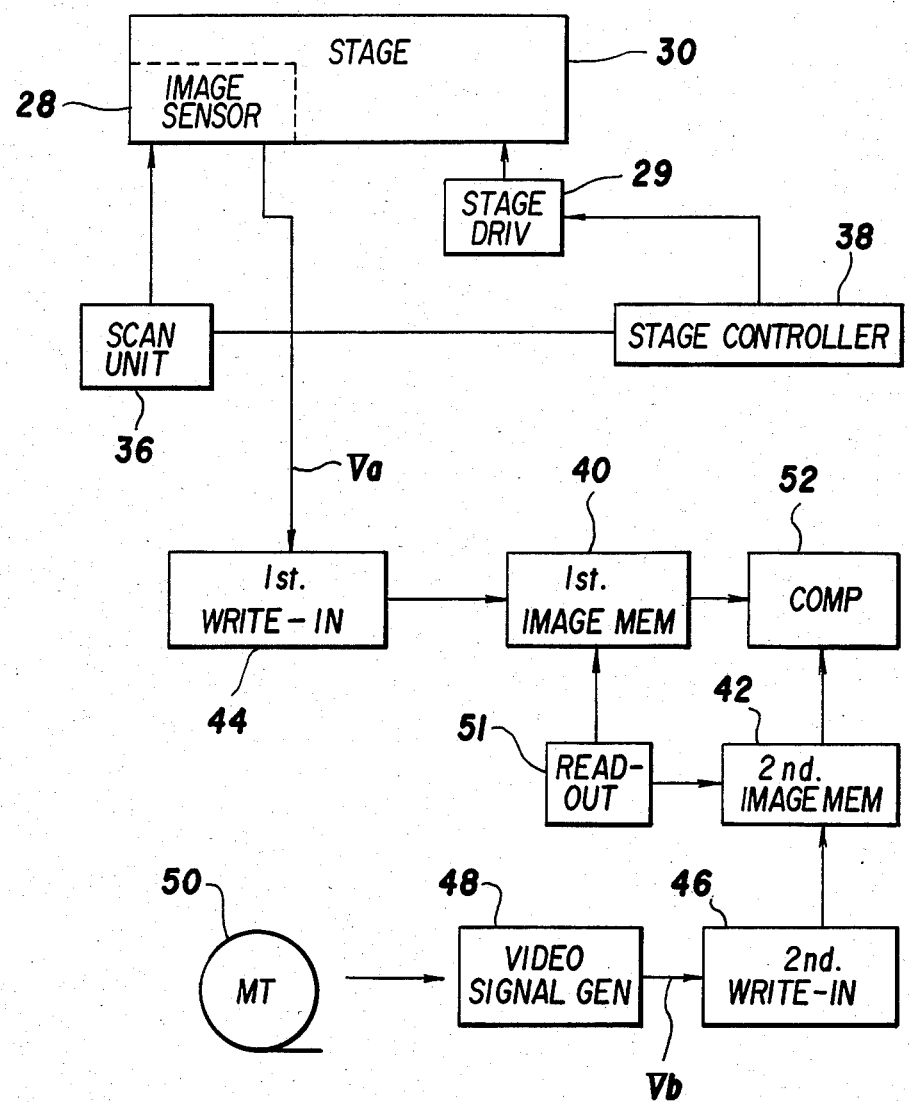
FIG. 7 is a block diagram of an inspecting system embodying the present invention relating to FIGS. 5 and 6.

A preferred embodiment for the present invention will be disclosed with regard to FIGS. 5, 6, and 7. The inspected object of the present invention is a mask pattern, so either technique as shown in FIG. 1 or 2 can be used. In this embodiment, the technique of FIG. 2 will be disclosed; that is, the reticle pattern is printed directly on the wafer. FIG. 5 illustrates a semiconductor pattern system having a reticle, and an optical system, and a stage.

In FIG. 5, a reticle pattern 60 is on the reticle 12, 30 is a stage for mounting a wafer, 26 is a wafer, 22 is a first window open at the surface of the stage 30 and the wafer 26 is mounted in the window 22. 24 is a second window beside the first window 22 in which an image sensor 28 is mounted, and 20 is an optical system by which an optical image of the reticle pattern 60 is exposed and printed on the wafer 26. The reticle pattern 60 is also projected on the image sensor 28 by means of a switching operation. The optical system 20 is for exposing and printing the reticle pattern 60 on the wafer 26 so that each printed IC pattern is placed in a respective block of a checked pattern 261 by moving the stage 30 sequentially. Usually the optical system 20 has a reduction factor between 1/10 and 1/5. In this system, additional function is provided to inspect the optical image of the reticle pattern 60 before exposing it on the wafer 26. The inspection is done by projecting the optical image of the reticle pattern 60 onto the image sensor 28 before exposing it on the wafer 26. The inspection is done by projecting the optical image toward the image sensor 28 by shifting the stage 30. The reticle 12, the optical system 20, and the stage 30 are installed in an airtight housing (not shown) so that the mask pattern and wafer can be kept dust free.

In FIG. 6, the same reference numerals designate the same elements as in FIG. 5, 34 is a housing for the stage, 341 is a bottom plate which supports the wafer 26 in the housing 34, pushing up the wafer 26 from the bottom, and 32 is a sliding shutter to protect the wafer 26 from the exposure to light during the inspection by the image sensor.

FIG. 7 shows a block diagram for a control system for the inspection system of the present invention. In the figure, the reference numerals which are the same as FIG. 5 or 6, designate respectively the same element, and 29 is a stage driver which drives the stage 30 in the X and Y direction (see FIG. 5), 36 is a scanning unit to sequentially switch the multi-elements of the imaging sensor 28 to convert the optical image corresponding to the multi-elements into electric signals. 38 is a stage controller which controls the scanning of the stage 30 and the scanning unit 36. $V_a$ is a sensor video signal which is the output signal of the image sensor 28, and 44 is a first write-in unit which writes the sensor video signal $V_a$ into a first image memory 40. 50 is a magnetic tape (MT) on which the design data to fabricate the IC pattern is stored, and 48 is a video signal generator. $V_b$ is a data video signal, 46 is a second write-in unit, 42 is a second image memory, and 51 is a read-out unit which controls the first memory 40 and the second memory 42 to read out the stored signals and apply them to a comparator 52. The comparator 52 compares the signal from the actual reticle pattern with the signal from the standard data stored on the magnetic tape.

The operation of the embodiment is as follows.

First, preparation for the exposure is performed by mounting the wafer 26 on the stage 30 as shown in FIG. 6 and installing the reticle 12 as shown in FIG. 5. When the preparation has been completed, in the operation of the prior art inspection, an exposing procedure is started; namely, the stage is moved so that the wafer 26 is moved such that the mask pattern 60 is exposed at a respective position of the wafer 26 by the step and repeat process, then each IC pattern is printed in each square (reference numeral 261 in FIG. 5) that corresponds to each chip of the IC as shown in FIG. 5. However, in the present invention, mask pattern 60 is first projected onto the second window 24, before beginning the exposing process on the wafer 26. The optical image of the reticle pattern 60, projected onto the second window 24, is scanned by the image sensor 28 and converted to a video signal, namely, sensor video signal $V_a$. The sensor video signal $V_a$ is stored sequentially in the first image memory 40 through the first writing unit 44. The stored video signal, includes a signal indicative of a defect or dust if they exist on the mask pattern 60 or on the reticle 12.

At the same time, design data for the reticle pattern 60, stored in the MT 50, is read out and converted into the data video signal $V_b$, and memorized in the second image memory 42. The data video signal $V_b$ stored in the second image memory 42, is used as a standard signal for comparison with the sensor video signal $V_a$ stored in the first image memory 40. Both video signals $V_a$ and $V_b$ are read out from the image memories 40 and 42 respectively and are applied to the comparator 52 by the control of the read-out unit 51. The inspection can be made by means of comparator 52 comparing the sensor video signal $V_a$ with the data video signal $V_b$. As the mask pattern 60 was made by an original pattern which was made by the design data, the sensor video signal $V_a$ must be equal to the data video signal $V_b$. If the sensor video signal $V_a$ includes a defect which might be caused by failure in the patterning process for the mask pattern 60, or dust on the reticle 12, the comparator 52 detects the abnormality.

There are several kinds of the image sensors 28. For example, a two-dimensional image sensor can be used as the image sensor. The two-dimensional image sensor consists of two-dimensional, multi-elements of the sensor. The size of the sensor is equal to the size of a single block of the check pattern 261 in FIG. 5, and it is also equal to the size of one IC chip pattern to be printed on the wafer 26. Therefore, when the optical image of the reticle pattern 60 is projected onto the image sensor, the sensor video signal $V_a$ can be provided simultaneously without scanning the stage 30. As an alternative, a one-dimensional image sensor (a line sensor) also can be applied. This sensor consists of multi-elements arranged in a line corresponding to either side of the rectangular reticle pattern 60. The sensor video signal $V_a$ along the line is simultaneously provided. For example, if the direction of the sensors are aligned in X direction, the two-dimensional video signal can be obtained by mechanically scanning the stage 30 in Y direction. FIG. 7 shows the use of a one-dimensional image sensor, wherein the sensor video signal $V_a$ must be synchronized with the scanning (switching) of the scanning unit 36 and the scanning of the stage 30. This synchronization can be accomplished by the scanning unit 36 and the stage driver 29 controlled by the control signals from the stage controller 38.

Further, instead of the optical system 20 in FIG. 5, other types of optical systems can be used to project the reticle pattern 60 on the image sensor 28, apart from the optical system for printing the wafer. And the optical image of the reticle pattern on the image sensor is enlarged with respect to the exposed image on the wafer. This system is effective to satisfy the resolution of the image sensor when the mask pattern is very complicated and requires many picture elements.

The video signal generator 48 is required to convert the form of the design data in the MT 50 into the form of the data video signal $V_b$ for easily comparing the sensor video signal $V_a$ with the design data. Because, the data stored in the MT 50 generally has a vector form, the data is required to be converted to the form of the sensor video signal $V_a$.

The first image memory 40 and the second image memory 42 each have memory cells. The number of memory cells is defined by the number of picture elements of the mask pattern which is also defined by the required resolution with respect to the IC pattern. Considering the above, if the mask pattern can be divided to N lines and M picture elements per line, the memory cells also can be arranged N lines and M cells per line, so that the total data capacity of each image memory becomes $N \times M$ bits.

The resolution of the optical system 20 is also defined by the resolution of the IC pattern. Therefore, it is not necessary to be concerned with dust when the dust is so tiny that it can not be resolved by the optical system 20.

In the above disclosure, the description has been presented with respect to the technique of printing the reticle pattern directly on the wafer, but it will be clear that the process described above can be applied to a technique using a photomask.

In any case, the pattern checking method of the present invention is performed just prior to actually exposing the printing pattern on the wafer. Therefore, it is very effective to decrease the failure due to a defect in the reticle pattern. It is also very effective to increase the yield and decrease the manufacturing cost of ICs. Although the disclosure of the present invention has been for IC fabrication, it will be clear the process can be applied to any semiconductor device manufacturing.

The above embodiment has disclosed the inspection which is performed just prior to actually exposing the printing pattern from the reticle on the wafer, however a similar effect can be obtained by applying the present invention to an optical image of the mask pattern just prior to exposing the mask pattern from the reticle onto the photomask and just prior to exposing the mask pattern from the photomask onto the wafer.

It is readily apparent that the above-described inspection method for a mask pattern used in semiconductor device fabrication meets all of the objects mentioned above and also has the advantage of wide commercial utility. It should be understood that the specific form of the invention hereinabove described is intended to be representative only, as certain modifications within the scope of these teachings will be apparent to those skilled in the art. Accordingly, reference should be made to the following claims in determining the full scope of the invention.

I claim:

1. An inspection method for a mask pattern used in semiconductor fabrication which uses an optical system for exposing said mask pattern on a fabricated object and printing said mask pattern; thereon, the inspection method comprising the steps of:
    projecting an optical image of said mask pattern onto an image sensor provided on a stage having said fabricated object mounted thereon;
    converting said optical image into a sensor video signal;
    generating a data video signal from design data used in fabricating said mask pattern, and
    comparing said sensor video signal to said data video signal for determining whether said mask pattern is normal.

2. The inspection method according to claim 1, wherein said steps are performed prior to exposing said mask pattern onto said fabricated object and wherein exposing said mask pattern onto said fabricated object is performed after said mask pattern has been determined to be normal.

3. An inspection apparatus for a mask pattern used in semiconductor fabrication, said apparatus comprising:
   an optical system for exposing said mask pattern on a fabricating object;
   an image sensor means for receiving an optical image of said mask pattern and for converting said optical image to a sensor video signal;
   data generating means for generating a data video signal from design data used in fabricating said mask pattern; and
   comparator means, coupled to said image sensor means and said data generating means, for comparing the output of said image sensor means to the output of said data generating means, said comparator means providing an indication of the difference therebetween;
   wherein said optical system comprises a single optical system for reducing and projecting said optical image of said mask pattern on a fabricated object and said image sensor.

4. The inspection apparatus according to claim 3, wherein said mask pattern comprises a mask pattern on a reticle.

5. The inspection apparatus according to claim 3, wherein said mask pattern comprises a single pattern.

6. The inspection apparatus according to claim 5, wherein said a single mask pattern comprises the mask pattern on a reticle.

7. The inspection apparatus according to claim 3, wherein said mask pattern comprises a plurality of patterns each having the same shape and size.

8. The inspection apparatus according to claim 7, wherein said plurality of mask patterns comprise the reticle patterns on a reticle.

9. The inspection apparatus according to claim 3, wherein said fabricated object comprises a semiconductor wafer.

10. The inspection apparatus according to claim 3, wherein said fabricated object comprises a photomask.

11. The inspection apparatus according to claim 3, wherein said image sensor means comprises a two-dimensional image sensor having a plurality of sensor elements arranged in an image plane, said image sensor means simultaneously converting said optical image of said mask pattern to said sensor video signal.

12. The inspection apparatus according to claim 3, wherein said image sensor means comprises a one-dimensional image sensor having a plurality of sensor elements arranged in a line parallel to one side of said optical image of said mask pattern, said image sensor means mechanically scanning said optical image in a direction perpendicular to the line of sensor arrangement, and converting said optical image of said mask pattern to said sensor video signal.

13. An inspection apparatus as set forth in claim 3, further including first memory means for storing said sensor video signal and second memory means for storing said data video signal, wherein the outputs of said first and second memory means are combined in said comparator means.

14. An apparatus for inspection of a mask pattern and the fabrication of a semiconductor device, said apparatus comprising:
   an image sensor means for receiving an optical image of said mask pattern and for converting said optical image to a sensor video signal;
   data generating means for generating a data video signal from data design data used in fabricating said mask pattern;
   comparator means, coupled to said image sensor means and said data generating means, for comparing the output of said image sensor means to the output of said data generating means, said comparator means providing an indication of the difference therebetween, said difference being indicative of a defect in said mask pattern; and
   optical system means for first exposing said mask pattern on said image sensor means and then on an object to be fabricated whereby defects in said mask pattern are determined prior to the exposure of said mask pattern on the object to be fabricated.

15. The apparatus according to claim 14, wherein said mask pattern comprises a mask pattern on a reticle.

16. The apparatus according to claim 14, wherein said mask pattern comprises a single pattern.

17. The apparatus according to claim 16, wherein said single mask pattern comprises the mask pattern on a reticle.

18. The apparatus according to claim 14, wherein said mask pattern comprises a plurality of patterns each having the same shape and size.

19. The apparatus according to claim 18, wherein said plurality of mask patterns comprise the reticle patterns on a reticle.

20. The apparatus according to claim 14, wherein said fabricated object comprises a semiconductor wafer.

21. The apparatus according to claim 14, wherein said fabricated object comprises a photomask.

22. The apparatus according to claim 14, wherein said image sensor means comprises a two-dimensional image sensor having a plurality of sensor elements arranged in an image plane, said image sensor means simultaneously converting said optical image of said mask pattern to said sensor video signal.

23. The apparatus according to claim 14, wherein said image sensor means comprises a one-dimensional image sensor having a plurality of sensor elements arranged in a line parallel to one side of said optical image of said mask pattern, said image sensor means mechanically scanning said optical image in a direction perpendicular to the line of sensor arrangement, and converting said optical image of said mask pattern to said sensor video signal.

24. An apparatus as set forth in claim 14, further including first memory means for storing said sensor video signal and second memory means for storing said data video signal, wherein the outputs of said first and second memory means are combined in said comparator means.

* * * * *